United States Patent
Mills et al.

(10) Patent No.: US 9,572,271 B2
(45) Date of Patent: Feb. 14, 2017

(54) WIRELESS ACCESS DEVICE ISOLATION CABINET

(71) Applicant: Facebook, Inc., Menlo Park, CA (US)

(72) Inventors: Richard Steven Mills, Cedar Park, TX (US); Fraidun Akhi, Fremont, CA (US); Justin Andrew Boseant, Redwood City, CA (US); Irina Mikhaylovna Somin, Mountain View, CA (US); Marquis Thomas, Union City, CA (US); John Timon, Livermore, CA (US); William Redhawk Espinoza, Prineville, OR (US); Kriston A. Boston, Stockton, CA (US); Jonathan Richard Cook, San Francisco, CA (US); Paul Robert Reynolds, Bend, OR (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 14/750,730

(22) Filed: Jun. 25, 2015

(65) Prior Publication Data

US 2016/0381818 A1 Dec. 29, 2016

(51) Int. Cl.
*G01M 99/00* (2011.01)
*H05K 5/02* (2006.01)
*H04W 88/08* (2009.01)

(52) U.S. Cl.
CPC .......... *H05K 5/0217* (2013.01); *G01M 99/005* (2013.01); *H04W 88/08* (2013.01); *H05K 5/0234* (2013.01); *H05K 5/0247* (2013.01)

(58) Field of Classification Search
CPC ............................. G01M 99/005; G06F 1/187

USPC .................................................. 361/724–728
See application file for complete search history.

(56) References Cited

U.S. PATENT DOCUMENTS

| 4,167,983 | A  * | 9/1979  | Seider .................. | B62D 51/005 180/19.1 |
| 6,008,621 | A  * | 12/1999 | Madison ............... | H02J 7/0042 320/107 |
| 6,218,796 | B1 * | 4/2001  | Kozlowski ............ | G06F 1/1632 318/139 |
| 6,671,160 | B2 * | 12/2003 | Hayden ................. | H05F 3/02 361/212 |
| 6,809,254 | B2 * | 10/2004 | Clement .............. | H05K 9/0045 174/389 |
| 6,963,495 | B1 * | 11/2005 | Carullo ................ | H05K 7/1425 174/382 |
| 7,042,736 | B2 * | 5/2006  | Katakura ........... | G11B 33/1493 361/797 |

(Continued)

*Primary Examiner* — Adrian S Wilson
(74) *Attorney, Agent, or Firm* — Perkins Coie LLP (57) ABSTRACT

Technology is provided for a wireless access device isolation cabinet for use in software testing on multiple mobile devices. The wireless access device isolation cabinet isolates each wireless access device and the mobile devices communicating with the wireless access device from other nearby wireless access devices. The wireless access device isolation cabinet can include an enclosure having a plurality of walls configured to enclose an isolation region. The walls are electrically conductive to shield electromagnetic interference from entering or exiting the isolation region. A wireless access device is disposed in the isolation region to communicate with one or more mobile devices. A device tray comprising a non-conductive panel and a pair of support beams is mounted within the isolation region and configured to support the mobile devices.

19 Claims, 7 Drawing Sheets

(56) References Cited

U.S. PATENT DOCUMENTS

| | | | |
|---|---|---|---|
| 7,055,833 B2* | 6/2006 | Wixted | B62B 3/006 280/47.34 |
| 7,130,190 B1* | 10/2006 | Baker | G06F 1/1632 280/47.35 |
| 7,230,791 B1* | 6/2007 | Ostwald | G11B 15/6835 360/92.1 |
| 7,369,416 B2* | 5/2008 | Plabst | H05K 9/0062 361/756 |
| 7,405,942 B1* | 7/2008 | Lewis | H05K 7/1415 361/724 |
| 7,710,731 B2* | 5/2010 | McClure | G06F 1/20 361/679.02 |
| 7,719,844 B2* | 5/2010 | Conn | H01L 24/29 361/727 |
| 7,800,914 B2* | 9/2010 | Dully | G06F 1/1632 361/756 |
| 7,806,337 B2* | 10/2010 | Pichardo | A61B 5/0002 235/440 |
| 7,987,799 B2* | 8/2011 | Lange | A47B 45/00 108/102 |
| 8,066,242 B2* | 11/2011 | Potter | G06F 1/188 248/200 |
| 8,079,481 B2* | 12/2011 | Canfield | H05K 7/183 211/184 |
| 8,320,110 B2* | 11/2012 | Chen | G06F 1/1632 235/462.46 |
| 8,498,113 B2* | 7/2013 | Tran | H03M 13/1102 174/50 |
| 8,508,956 B2* | 8/2013 | Nicol | H05K 9/0054 361/752 |
| 9,182,793 B2* | 11/2015 | Ergun | G06F 1/1607 |
| 2002/0122271 A1* | 9/2002 | Coffin | G11B 15/6835 360/92.1 |
| 2003/0141687 A1* | 7/2003 | Wixted | B62B 3/006 280/47.35 |
| 2008/0165504 A1* | 7/2008 | McCoy | F16M 11/08 361/724 |
| 2011/0267782 A1* | 11/2011 | Petrick | G06F 1/1628 361/724 |
| 2012/0176906 A1* | 7/2012 | Hartenstein | H04L 12/2697 370/241 |
| 2012/0229971 A1* | 9/2012 | Mills | H05K 7/1489 361/679.46 |
| 2014/0125209 A1* | 5/2014 | Kyle | G06F 1/183 312/317.1 |
| 2014/0126129 A1* | 5/2014 | Kyle | G06F 1/187 361/679.02 |
| 2015/0223348 A1* | 8/2015 | Sagar | G06F 1/26 713/340 |
| 2016/0073545 A1* | 3/2016 | Cravens | G06F 1/187 361/679.32 |

\* cited by examiner

WIRELESS ACCESS DEVICE ISOLATION CABINET

TECHNICAL FIELD

This patent application is directed to data storage server configurations and, more specifically, to a wireless access device isolation cabinet.

BACKGROUND

There are a vast number of applications that run on mobile devices. As application software is updated, improved, or otherwise changed, that software should be tested. In many instances, it is desirable to test the software on actual mobile devices. This is usually accomplished by communicating with multiple mobile devices via a wireless access device. Traditionally, multiple mobile devices are mounted in a room with multiple wireless access devices communicating with various sets of the mobile devices. However, testing efficiency can be affected by interference associated with having multiple wireless access devices operating in the same space.

BRIEF DESCRIPTION OF THE DRAWINGS

Embodiments of the wireless access device isolation cabinet introduced herein may be better understood by referring to the following Detailed Description in conjunction with the accompanying drawings, in which like reference numerals indicate identical or functionally similar elements.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. On the contrary, the embodiments are intended to cover all modifications, equivalents, and alternatives falling within the scope of the embodiments as defined by the appended claims.

DETAILED DESCRIPTION

Overview

A wireless access device isolation cabinet is disclosed for use in testing software on multiple mobile devices. The wireless access device isolation cabinet isolates each wireless access device and the mobile devices communicating with the wireless access device from other nearby wireless access devices. In an embodiment, the wireless access device isolation cabinet comprises an enclosure including a plurality of walls configured to enclose an isolation region. The walls are electrically conductive to shield electromagnetic interference from entering or exiting the isolation region. A wireless access device is disposed in the isolation region to communicate with one or more mobile devices. A device tray comprising a non-conductive panel and a pair of support beams is mounted within the isolation region and configured to support the mobile devices.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

Figure 1:
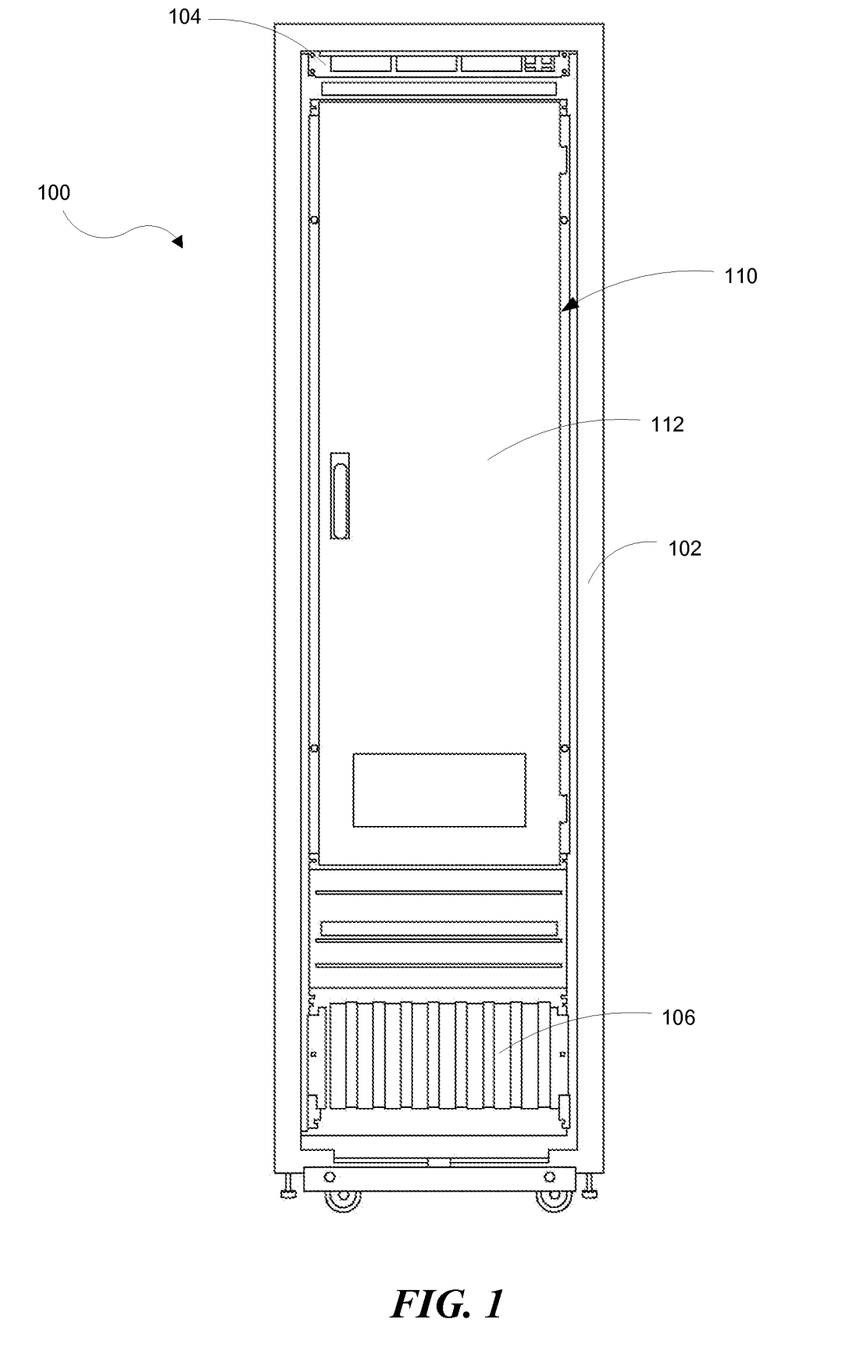
FIG. 1 is a front view in elevation of a wireless access device isolation cabinet, according to a representative embodiment.

FIG. 1 illustrates a wireless access device isolation cabinet 100 according to a representative embodiment. The wireless access device isolation cabinet 100 includes a rack 102 that supports an enclosure 110. In some embodiments, the rack 102 is a standard electronic industry alliance (EIA) component rack. The enclosure 110 is a faraday cage that encloses an isolation region 113 (FIG. 2) that is shielded from electromagnetic interference (EMI), such as radio-frequency interference (RFI). The enclosure 110 includes a door 112 to provide access to the interior isolation region of the enclosure 110. The rack 102 can also support additional devices, such as switch 104 and servers 106, for example.

Figure 2:
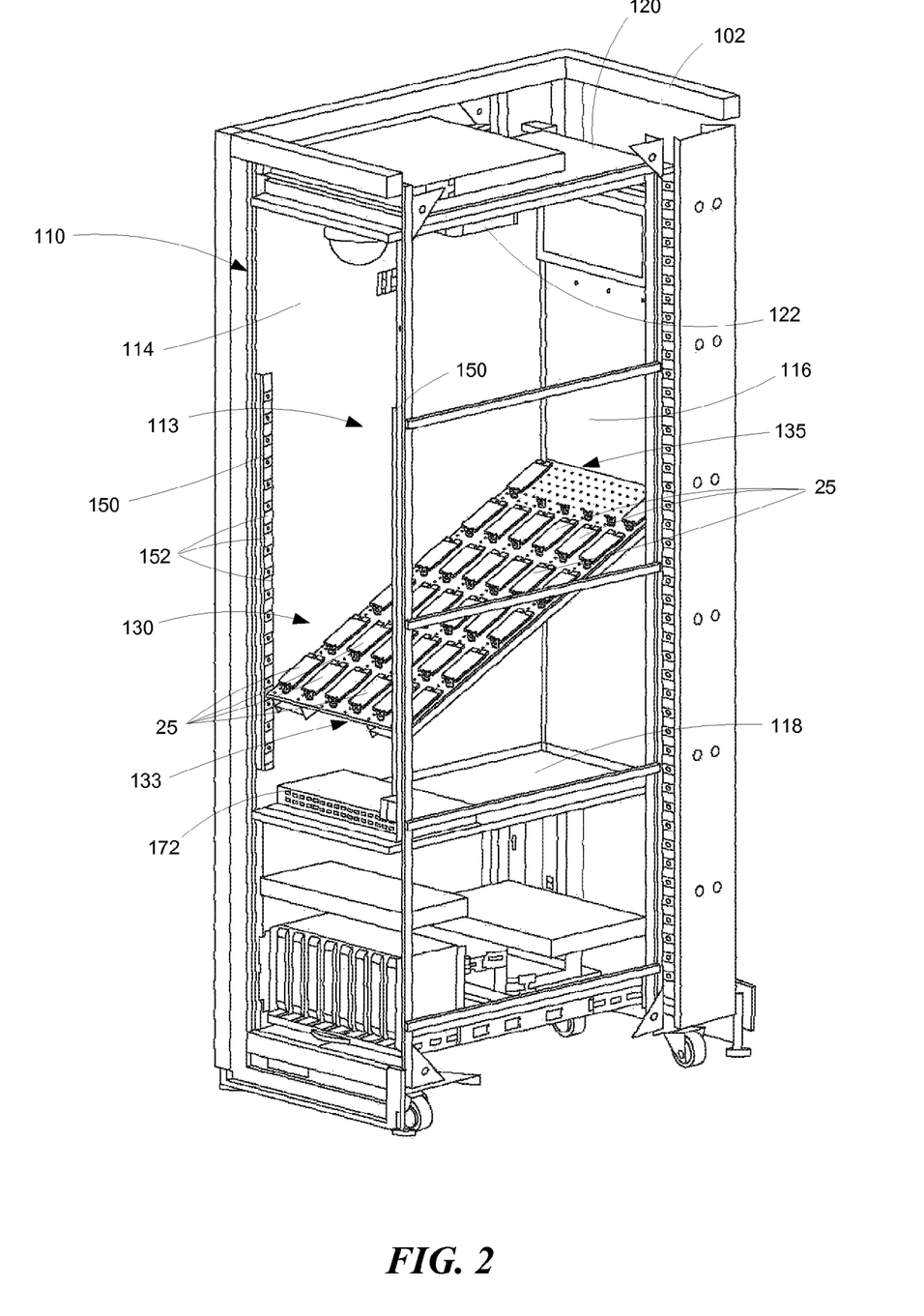
FIG. 2 is an isometric view of the wireless access device isolation cabinet, shown in FIG. 1, with several walls not shown for clarity.

As shown in FIG. 2, the enclosure 110 includes a plurality of walls or panels that are configured to enclose the isolation region 113. The isolation region 113 is surrounded by side wall 114, back wall 116, top wall 120, and bottom wall 118. Although not shown in FIG. 2, enclosure 110 also includes a side wall opposite side wall 114. The walls can be comprised of electrically conductive material, such as one or more layers of a metal mesh, sheet metal, or perforated sheet metal. The metal layers are grounded to dissipate any electric currents generated from external or internal electromagnetic fields. The disclosed wireless access device isolation cabinet 100 provides a minimum of 60 dB isolation between approximately 2 GHz and approximately 6 GHz. When multiple cabinets are used in close proximity, 120 dB total isolation is provided from cabinet to cabinet. Accordingly, multiple wireless access device isolation cabinets 100 can be used to operate multiple wireless access devices 122 without interference or cross-talk between devices.

A wireless access device 122 is mounted in the isolation region 113 on the top wall 120. In some embodiments, the wireless access device 122 is a wireless local area network (WLAN) device. A communication hub 172 is mounted to bottom wall 118 inside the isolation region 113. A device tray 130 is mounted in the isolated region 113 and is configured to support one or more devices 25 (e.g., mobile phones, tablets, or other handheld electronic devices) that are capable of communicating with the wireless access device 122. The device tray 130 includes a proximal end 133 and a distal end 135. The proximal end 133 connects to tray brackets 150 positioned adjacent the door 112 (see FIG. 1). The distal end 135 rests against the back wall 116. The tray brackets 150 include a plurality of engagement locations 152 such that the vertical position of the device tray 130 can be adjusted within the isolation region. It should be appreciated that the device tray 130 of the illustrated embodiment rests against the back wall 116 at an angle depending on the length of the device tray 130. The length of the device tray 130 can be selected based on the number and size of devices 25 that are to be used in testing. In at least one embodiment, a plurality of rails or support brackets can be coupled to the walls and configured to support one or more device trays 130 within the isolation region substantially horizontally or another selected angle relative to horizontal. In some embodiments, one or more device trays 130 are supported substantially vertically within the isolation region.

Figure 3:
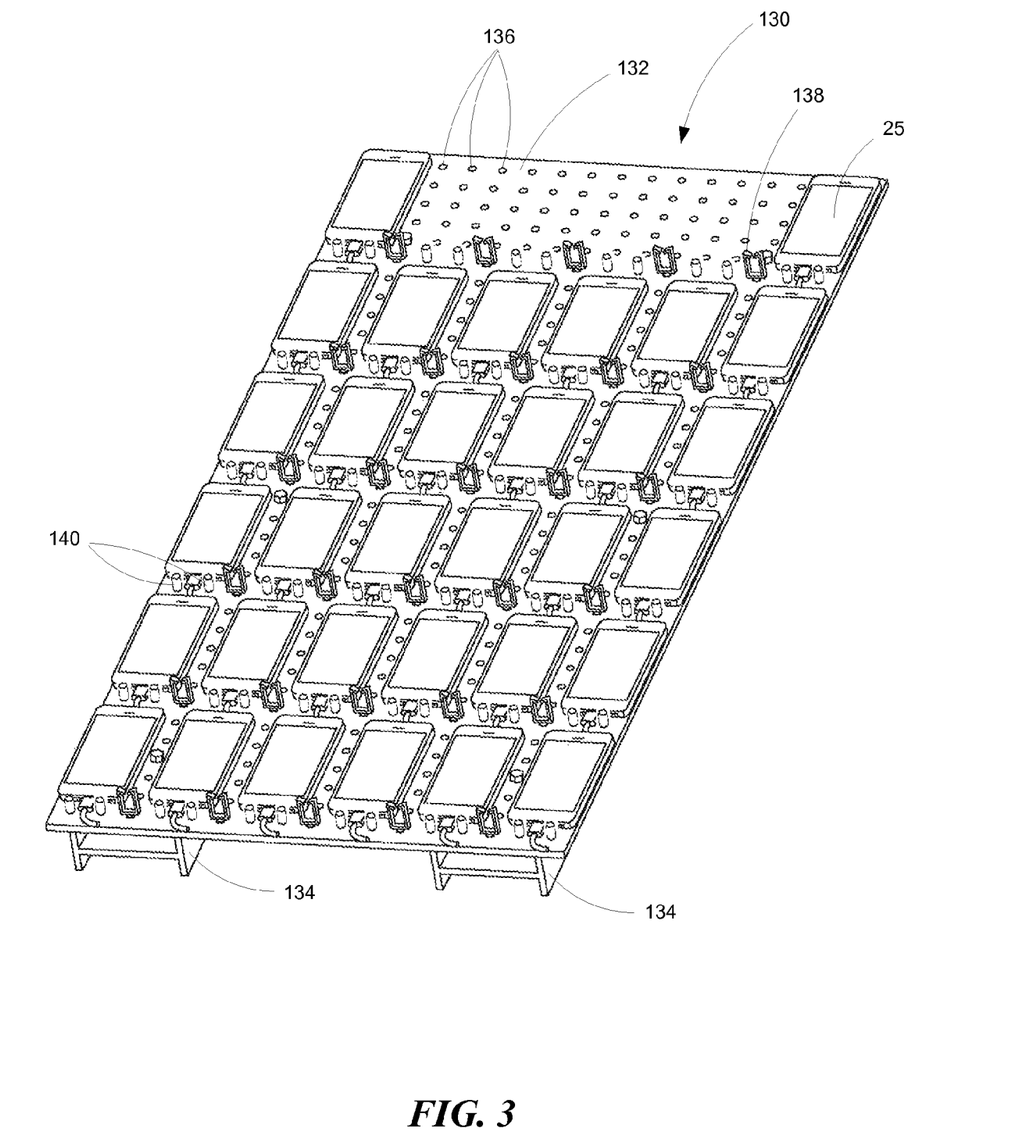
FIG. 3 is an isometric view of the device tray shown in FIG. 2.
Figure 4:
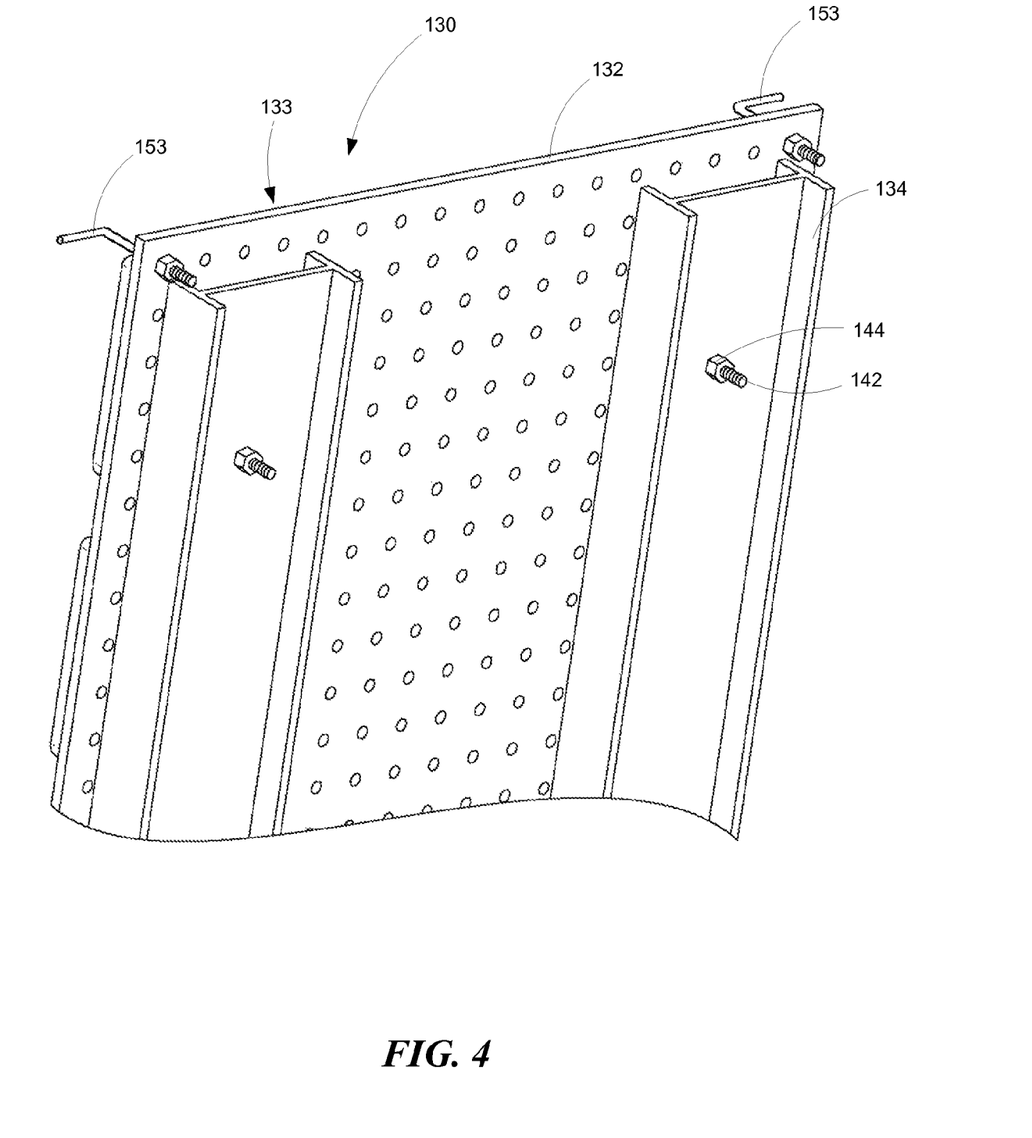
FIG. 4 is a partial isometric view of the device tray as viewed from underneath.

As shown in FIG. 3, the device tray 130 can include a panel 132 that includes an array of holes 136 configured to receive pegs 140. For example, pegs 140 are positioned in the holes 136 in order to support devices 25. The device tray 130 also includes a plurality of wire clips 138 to facilitate cable management. In some embodiments, the device tray 130 is comprised of a non-conductive material, such as plastic. The device tray 130 can include a pair of support beams 134 mounted to the panel 132. With further reference to FIG. 4, support beams 134 can comprise a fiberglass H-beam that is fixed to the panel 132 with suitable fasteners, such as bolts 142 and nuts 144. The device tray 130 can also include a pair of hooks 153 that are attached to the proximal end 133 of the device tray 130 and are operative to engage the engagement locations 152 of the tray brackets 150 (see FIG. 2).

Figure 5:
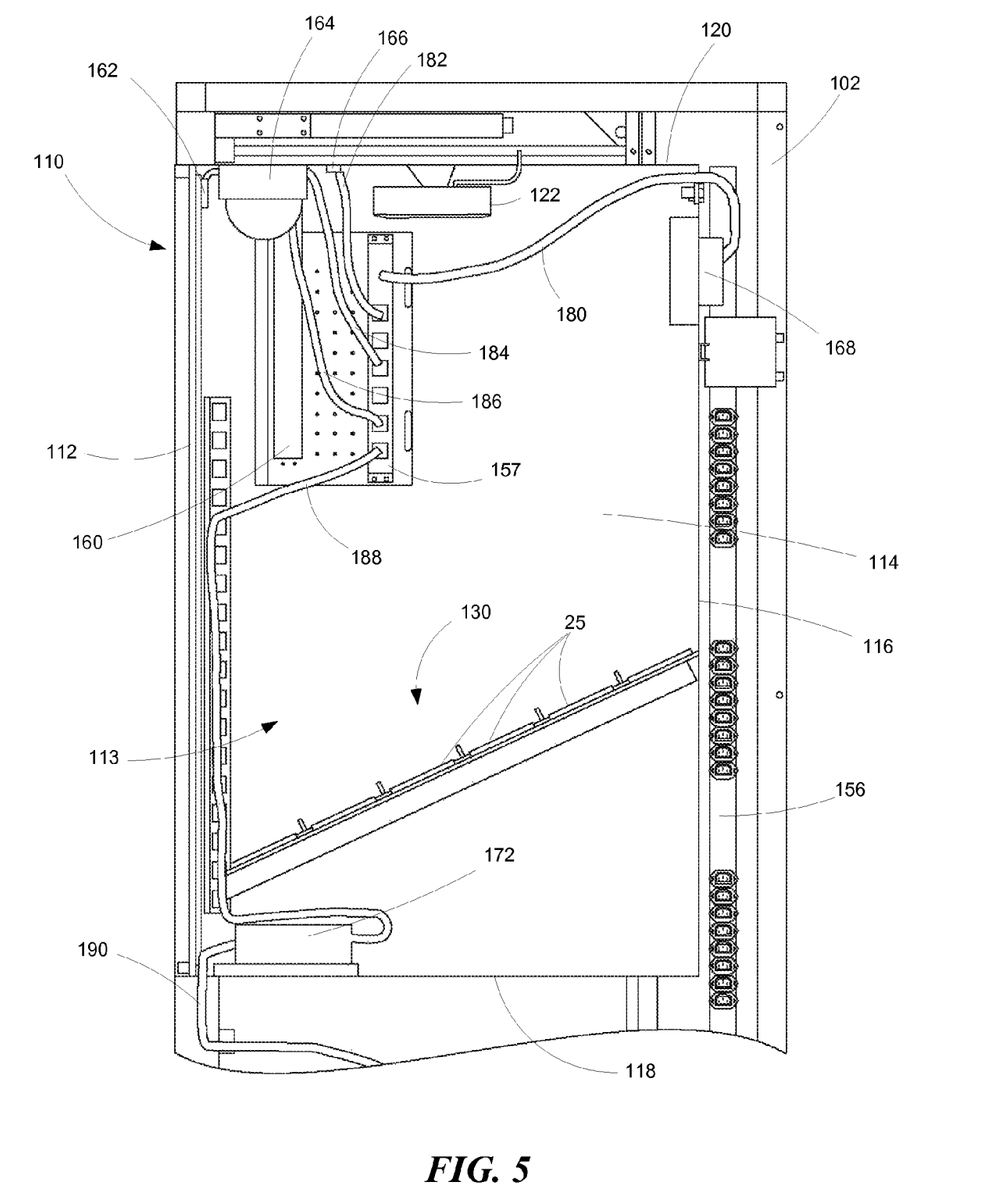
FIG. 5 is a partial side-view in cross-section of the wireless access device isolation cabinet.

As shown in FIG. 5, the enclosure 110 includes a light 166 (e.g., LED light) mounted to the top wall 120 to provide lighting for isolation region 113. The enclosure 110 can also include one or more cameras 164 mounted to a wall, such as the top wall 120, and facing the device tray 130 to provide remote monitoring of the devices 25 under test. In some embodiments, the camera 164 is an internet protocol (IP) camera. The door 112 can include a door sensor 162 to help ensure that the enclosure 110 is properly closed to seal against electromagnetic interference. In addition, the enclosure 110 can include an environmental sensor 160 mounted to side wall 114 to monitor, as an example, temperature, humidity and/or other environmental conditions within or around the isolated region 113.

In some embodiments, a primary power distribution unit 156 is mounted to the rack 102 outside of the enclosure 110 and provides power via a cable 180 to a secondary power strip 157 mounted inside the enclosure 110. The secondary power strip 157 in turn provides power to the other components mounted inside the enclosure 110. For example, a cable 182 provides power to the light 166, a cable 184 provides power to the door sensor 162, a cable 186 provides power to the camera 164, and a cable 188 provides power to the communication hub 172. The communication hub 172 communicates with servers 106 (see FIG. 1) via a cable 190. Thus, the communication hub 172 provides power and communication to the devices 25 to facilitate monitoring and programming of the devices 25. One or more fans 168 are mounted to the enclosure 110 to provide adequate airflow through the isolation region 113.

Figure 6:
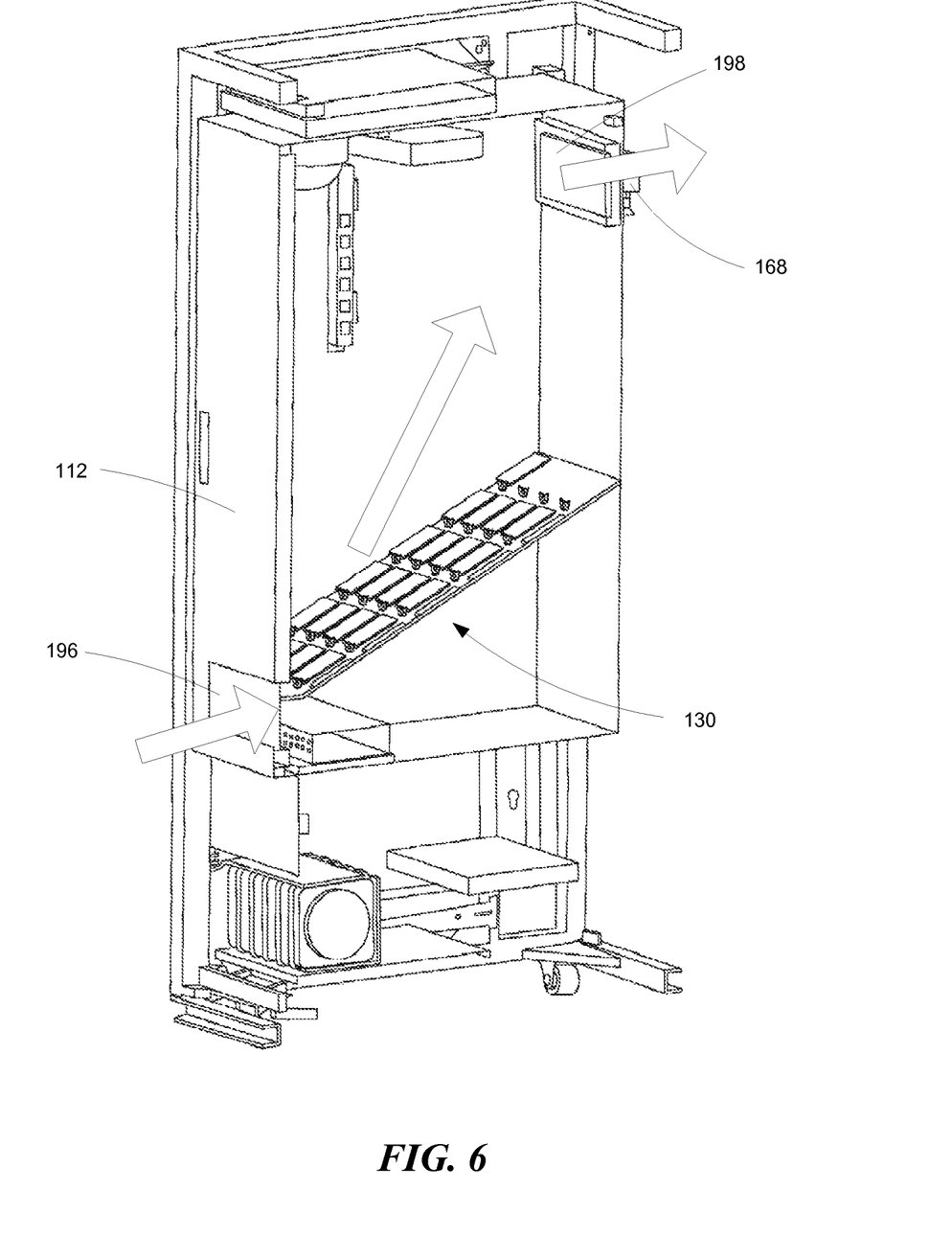
FIG. 6 is an isometric view in cross-section of the wireless access device isolation cabinet.
Figure 7:
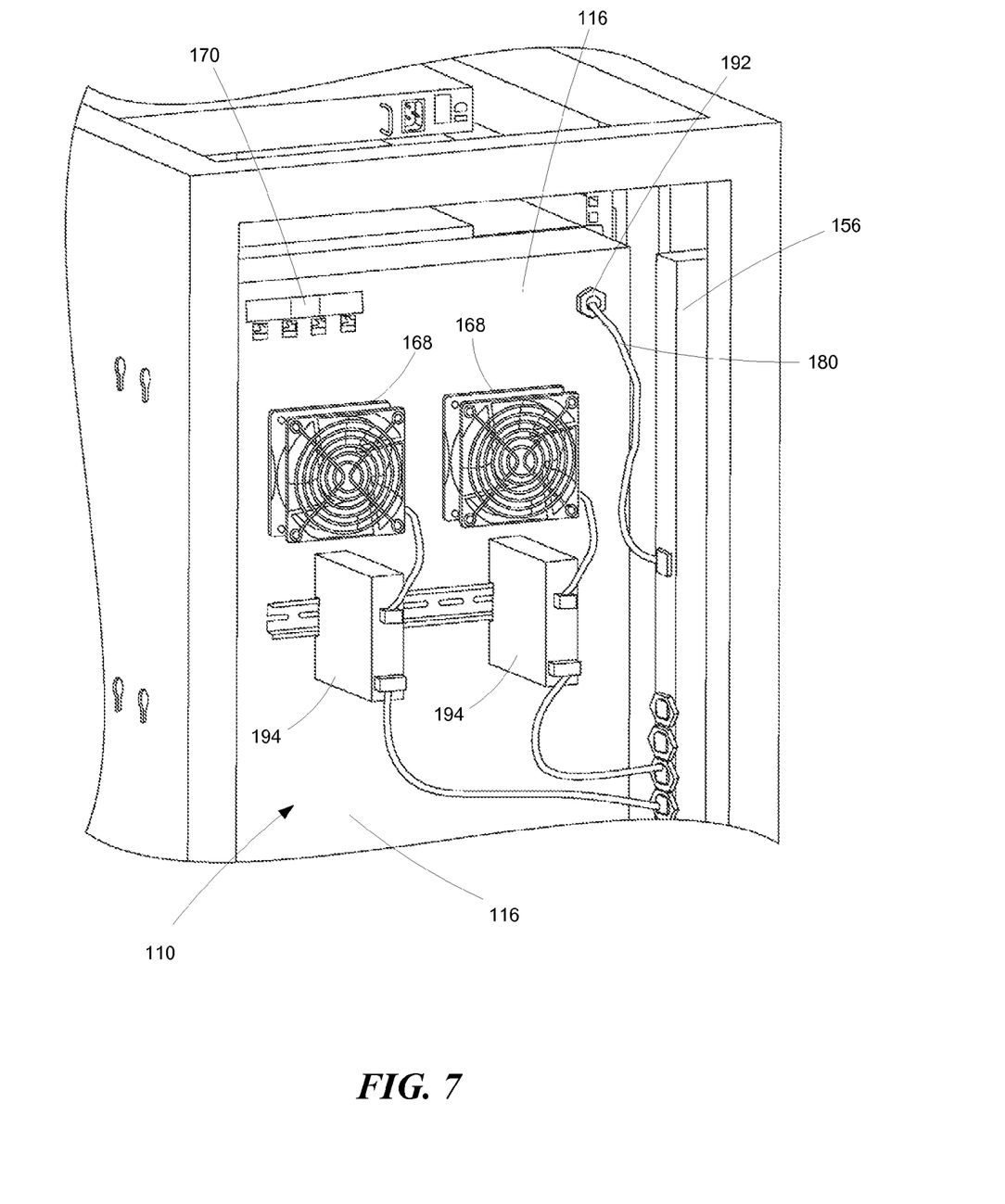
FIG. 7 is a partial isometric view of the wireless access device isolation cabinet as viewed from the back.

As shown in FIG. 6, the airflow created by fans 168 enters the lower portion of door 112 through a shielded fan grill 196, flows over the device tray 130, and out another shielded fan grill 198. With further reference to FIG. 7, the fans 168 are mounted to the back wall 116 of the enclosure 110. The fans 168 are controlled and powered by power supply units 194 that are in turn connected to the primary power distribution unit 156. The power supply cable 180 enters the enclosure 110 through a shielded cable gland 192. In some embodiments, the power supply cable 180 includes conductive braided shielding. Communication connections to the wireless access device 122, the camera 164, and the environmental sensor 160 (see FIG. 5) are provided through shielded bulkhead connectors 170. In some embodiments, the shielded bulkhead connectors 170 are RJ45 connectors.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A wireless access device isolation cabinet, comprising:
a rack;

an enclosure supported by the rack and including a plurality of walls configured to enclose an isolation region, the plurality of walls being electrically conductive and grounded to block electromagnetic interference relative to the isolation region;

a wireless access device disposed in the isolation region; and a device tray removably mounted within the isolation region and supported by at least one of the plurality of walls, the device tray being configured to support one or more devices capable of communicating with the wireless access device, wherein the device tray comprises a non-conductive panel.

2. The wireless access device isolation cabinet of claim 1, wherein the enclosure is removable from the rack.

3. The wireless access device isolation cabinet of claim 1, further comprising a door to provide access to the isolation region.

4. The wireless access device isolation cabinet of claim 3, wherein the device tray includes a proximal end and a distal end, wherein the proximal end connects to the enclosure adjacent the door and the distal end rests against one of the plurality of walls.

5. The wireless access device isolation cabinet of claim 3, further comprising a door sensor.

6. The wireless access device isolation cabinet of claim 1, further comprising a camera mounted in the isolation region.

7. The wireless access device isolation cabinet of claim 1, further comprising one or more environmental sensors mounted in the isolation region.

8. A wireless access device isolation cabinet, comprising:
an enclosure including a plurality of walls configured to enclose an isolation region and a door to provide access to the isolation region, the plurality of walls being electrically conductive and grounded to block electromagnetic interference from entering or exiting the isolation region;

a wireless access device disposed in the isolation region;

one or more tray brackets mounted in the isolation region adjacent the door; and a device tray configured to engage the one or more tray brackets and support one or more devices capable of communicating with the wireless access device, wherein the device tray comprises a non-conductive panel.

9. The wireless access device isolation cabinet of claim 8, wherein the one or more tray brackets include a plurality of engagement locations configured to receive the device tray.

10. The wireless access device isolation cabinet of claim 8, wherein the device tray includes a proximal end and a distal end, wherein the proximal end connects to the one or more tray brackets and the distal end rests against a wall opposite the door.

11. The wireless access device isolation cabinet of claim 10, wherein the device tray rests at an angle relative to the wall opposite the door.

12. The wireless access device isolation cabinet of claim 11, wherein the device tray further comprises a plurality of device retainers.

13. The wireless access device isolation cabinet of claim 8, further comprising a camera mounted in the isolation region.

14. A wireless access device isolation cabinet, comprising:
an enclosure including a plurality of walls configured to enclose an isolation region, the plurality of walls being electrically conductive to shield electromagnetic interference from entering or exiting the isolation region;

a wireless access device disposed in the isolation region; and a device tray comprising a non-conductive panel and a pair of support beams mounted within the isolation region and configured to support one or more devices capable of communicating with the wireless access device.

15. The wireless access device isolation cabinet of claim 14, wherein the non-conductive panel comprises plastic.

16. The wireless access device isolation cabinet of claim 14, wherein the pair of support beams each comprise a fiberglass H-beam.

17. The wireless access device isolation cabinet of claim 14, further comprising a door to provide access to the isolation region.

18. The wireless access device isolation cabinet of claim 17, wherein the device tray includes a proximal end and a distal end, wherein the proximal end connects to the enclosure adjacent the door and the distal end rests against one of the plurality of walls.

19. The wireless access device isolation cabinet of claim 18, further comprising one or more tray brackets mounted in the isolation region adjacent the door, wherein the proximal end of the device tray engages the one or more tray brackets.

* * * * *